US005432396A

United States Patent [19]

Sato et al.

[11] Patent Number: 5,432,396

[45] Date of Patent: Jul. 11, 1995

[54] WAVE-RECEIVING PIEZOELECTRIC DEVICE

[75] Inventors: Takashi Sato; Kazuyuki Suzuki; Nobuhiro Moriyama; Kenichi Nakamura, all of Iwaki, Japan

[73] Assignee: Kureha Kagaku Kogyo Kabushiki Kaisha, Japan

[21] Appl. No.: 208,849

[22] Filed: Mar. 11, 1994

[30] Foreign Application Priority Data

Mar. 12, 1993 [JP] Japan .................................. 5-077506

[51] Int. Cl.$^{6}$ .............................................. H01L 41/08

[52] U.S. Cl. .................................... 310/334; 310/337; 310/357

[58] Field of Search ............... 310/334, 337, 357, 358, 310/800; 367/140, 149, 150, 151, 157

[56] References Cited

U.S. PATENT DOCUMENTS 3,956,647 5/1976 Mitchell et al. ...................... 310/313
4,209,725 6/1980 Dieulesaint et al. ................ 310/313
4,384,231 5/1983 Ishikawa et al. ..................... 310/335
5,003,516 3/1991 Sato et al. ........................... 367/150
5,193,527 3/1993 Schäfer ........................... 128/24 EL
5,297,553 3/1994 Sliwa et al. ..................... 128/662.03
5,309,411 5/1994 Huang et al. ........................ 367/140
5,341,062 8/1994 Cero et al. .......................... 310/339

FOREIGN PATENT DOCUMENTS 2623930 12/1977 Germany ............................ 310/800

*Primary Examiner*—Thomas M. Dougherty
*Attorney, Agent, or Firm*—Wenderoth, Lind & Ponack

[57] ABSTRACT

A wave-receiving piezoelectric device for use as, e.g., a hydrophone or a microphone, is constituted by a piezoelectric body having two surfaces sandwiching a thickness and including at least one surface provided with a recess (including a perforation communicating with the two surfaces) set in the thickness direction, and a rigid member having a contact surface and an outer surface opposite to the contact surface and disposed to cover said at least one surface with the contact surface so as to make the recess airtight. As a result, an acoustic pressure received by the outer surface is concentrated and applied onto said at least one surface of the piezoelectric body, thereby giving an improved wave-receiving sensitivity at an enhanced acoustic pressure.

12 Claims, 3 Drawing Sheets

WAVE-RECEIVING PIEZOELECTRIC DEVICE

FIELD OF THE INVENTION AND RELATED ART

The present invention relates to a wave-receiving (or passive) piezoelectric device having an enhanced sensitivity of receiving an acoustic wave.

There have been known wave-receiving piezoelectric devices inclusive of a microphone which is generally placed in a gaseous medium such as air or a gas so as to receive an acoustic wave propagated through the gaseous medium, and a hydrophone which is generally placed in a liquid medium such as water or other liquids so as to receive an acoustic wave propagated through the liquid medium.

The acoustic wave-receiving sensitivity of such a piezoelectric device may be expressed in terms of a hydrostatic piezoelectric constant $d_h$ in case where the device has a sufficiently smaller size than the wavelength of the acoustic wave, and is of course better if the $d_h$ constant is larger.

Hitherto, the $d_h$ constant has been considered to be constant with respect to a piezoelectric material or body concerned which has been imparted with a piezoelectric property under a certain condition, and there have been few proposals, if any, for improving the $d_h$ constant through modification of a device structure so as to improve the sensitivity of the resultant piezoelectric device.

SUMMARY OF THE INVENTION

An object of the present invention is to realize a wave-receiving piezoelectric device having a higher sensitivity from a given piezoelectric material.

According to our study, it has been found possible to produce a piezoelectric device having a significantly enhanced wave-receiving sensitivity from a given piezoelectric body by providing a surface of the body with a recess in a sense of including a perforation through its thickness by surface-embossing or boring, and covering the surface with a rigid member so that an acoustic pressure received by the outer surface of the rigid member is concentrated and applied onto the surface of the piezoelectric body.

Thus, according to the present invention, there is provided a wave-receiving piezoelectric device, comprising:

a piezoelectric body having two surfaces sandwiching a thickness and including at least one surface provided with a recess set in the thickness direction, and a rigid member having a contact surface and an outer surface opposite to the contact surface and disposed to cover said at least one surface with the contact surface so as to make the recess airtight, whereby an acoustic pressure received by the outer surface is concentrated and applied onto said at least one surface of the piezoelectric body.

Herein, the term "recess" is used to mean not only a concavity near the surface but also a perforation piercing through the opposite surface. A non-perforation recess may be formed in any one or both of the two surfaces concerned of the piezoelectric body. In case where a non-perforation recess is formed in only one surface, it is possible to cover only the one surface with a rigid member but it is generally preferred to cover the two surfaces with rigid members so as to prevent an undesirable warp or distortion of the piezoelectric body per se even in this case.

The acoustic wave should be construed as a wave of pressure oscillation and is not restricted to an audio-frequency range of acoustic wave. More exactly, the acoustic wave contemplated herein is a wave of pressure oscillation having a wavelength comparable to or larger than the size of the rigid member. Further, the acoustic pressure means the pressure of the above-mentioned oscillation.

As described above, in the piezoelectric device according to the present invention, at least one surface of the piezoelectric body is provided with a recess and covered with a rigid member so that an acoustic pressure acting on the rigid member is concentrated to the remaining projection constituting a reduced area of the surface of the piezoelectric device thus applying an amplified acoustic pressure to the piezoelectric device. As a result, a piezoelectric constant of the piezoelectric material under the amplified higher pressure can be utilized. Further, as the recess of the piezoelectric body is covered airtight with the rigid member, the contribution of components of the $d_h$ constant corresponding to a component of the acoustic pressure acting on side surfaces of the piezoelectric body causing a deformation thereof in a direction of extension of the piezoelectric body among all the components of the $d_h$ constant inclusive of a component ($d_{33}$ component) in the direction of polarization (in the thickness direction in many cases) of the piezoelectric body and components ($d_{31}$ and $d_{32}$ components) in directions perpendicular to the polarization direction, is relatively suppressed due to the presence of the recess to which the action of the acoustic pressure is intercepted. This is also considered to be a factor contributing to an apparent increase in $d_h$ constant (as discussed in Japanese Patent Application No. 75009/1993). This assumption is corroborated by an increase in Piezoelectric performance (2) shown in Table 1 appearing hereinafter.

These and other objects, features and advantages of the present invention will become more apparent upon a consideration of the following description of the preferred embodiments of the present invention taken in conjunction with the accompanying drawings, wherein like reference numerals are used to denote like parts.

DESCRIPTION OF THE PREFERRED EMBODIMENTS

Figure 1A:
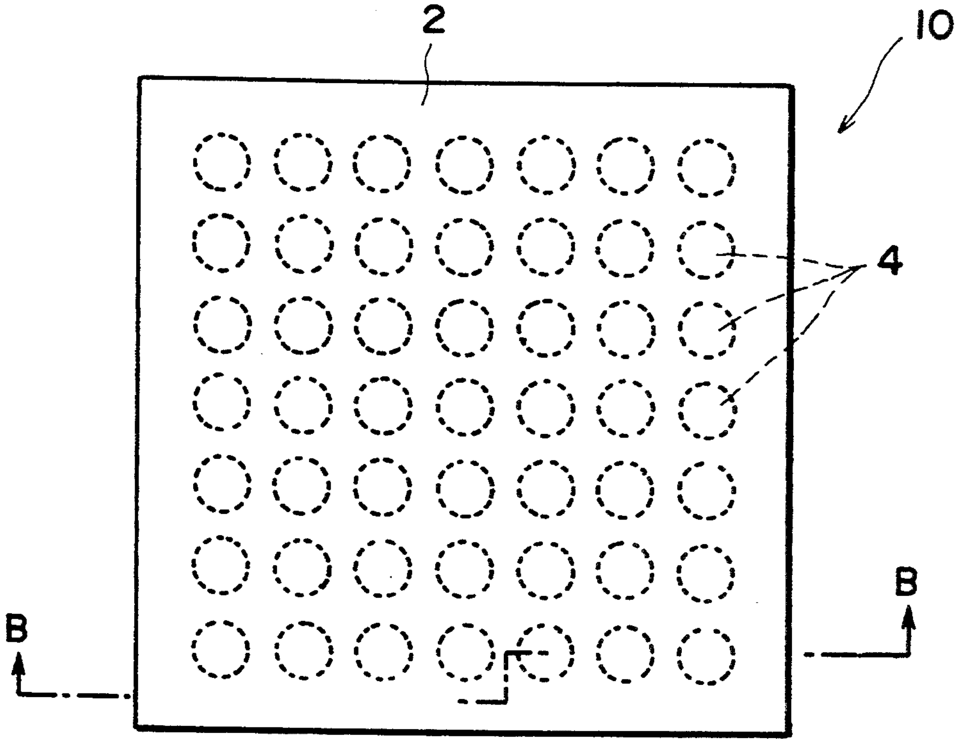
FIG. 1A is an embodiment of the wave-receiving piezoelectric device according to the present invention.
Figure 1B:
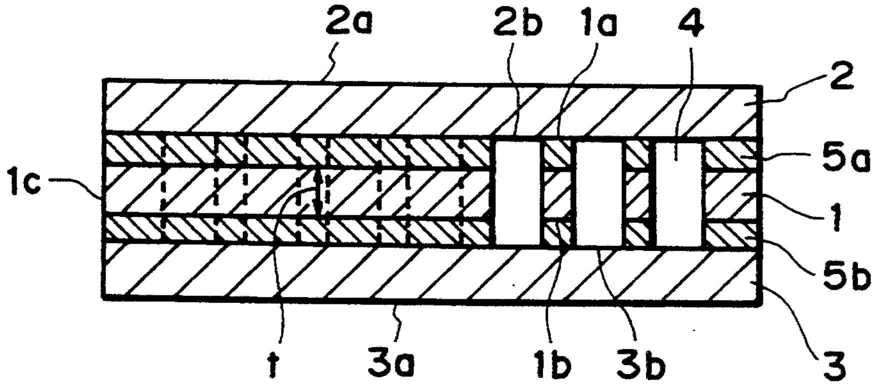
FIG. 1B is a thicknesswise sectional view taken along the line B—B as viewed in the direction of the arrows in FIG. 1A.

FIG. 1A is a plan view of an embodiment of the wave-receiving piezoelectric device (hereinafter simply called "piezoelectric device") according to the present invention and FIG. 1B is a thicknesswise sectional view taken along the line B—B in FIG. 1A. Referring to FIGS. 1A and 1B, a piezoelectric device 10 comprises a rectangular sheet-form piezoelectric body 1 having two surfaces 1*a* and 1*b* sandwiching a thickness t and a side face 1*c* disposed substantially perpendicular to the two surfaces, electrodes 5*a* and 5*b* disposed on the surfaces 1*a* and 1*b*, respectively, and a pair of rigid plates 2 and 3 having a similar planar shape as the piezoelectric body 1 and sandwiching the piezoelectric body 1 provided with the electrodes 5*a* and 5*b*. The piezoelectric body 1 laminated with the electrodes 5*a* and 5*b* are provided with a large number of small perforations 4 piercing through the thickness t at a substantially uniform density. The rigid plates 2 and 3 as rigid members of the present invention are disposed so as to shield the perforations from an acoustic pressure of a received acoustic wave. Actually, the rigid plates 2 and 3 are applied with an adhesive onto the surfaces of the electrodes 5*a* and 5*b*, whereby the perforations 4 converted into airtight internal spaces. In a piezoelectric device according to the present invention having a large number of small perforations 4 as shown, the piezoelectric device I may preferably be polarized in the direction of thickness t.

In the piezoelectric device of the above-described structure, the perforations 4 covered with the rigid plates 2 and 3 are converted to air-tight internal spaces, at which the inner surfaces 2*b* and 3*b* are shielded from an exterior acoustic wave. As a result thereof and corresponding to a reduction in pressed surface area (of the piezoelectric body 1 sandwiched by the rigid plates) due to the presence of the perforations 4, an acoustic pressure received by the outer surfaces 2*a* and 3*a* of the rigid plates is concentrated to the remaining surfaces 1*a* and 1*b* of the piezoelectric body with the aid of the rigidity of the rigid plates. As a result, the stress (load) applied to the piezoelectric body 1 is increased to provide a piezoelectric device showing a higher sensitivity than that given by a conventional piezoelectric device not including a combination of the perforations 4 and the rigid plates 2 and 3 of the present invention. Further, as will be described hereinafter, a sensitivity increase is also given by relatively decreasing the contribution of the $d_{31}$ and $d_{32}$ components, i.e., influence of an acoustic wave acting the side face 1*c* causing a deformation in the direction of extension of the sheet-form piezoelectric body 1, by the presence of the perforations 4 which are shielded from the acoustic pressure. In the embodiment shown in FIGS. 1A and 1B, the acoustic pressure concentrated in the above-described manner is applied to the piezoelectric body 1 via the electrodes 5*a* and 5*b*.

Figure 2:
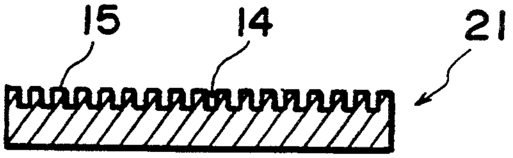
FIGS. 2 and 3 are respectively a thicknesswise sectional view of another example of piezoelectric body usable in the embodiment shown in FIGS. 1A and 1B.
Figure 3:
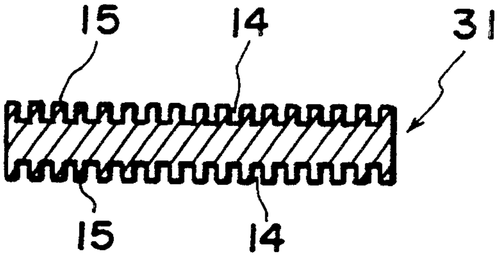

FIGS. 2 and 3 are sectional views of piezoelectric bodies 21 and 31, respectively, which can be used in place of the piezoelectric body 1 in the embodiment of FIGS. 1A and 1B. More specifically, the piezoelectric body 21 is an example of piezoelectric body provided with non-perforating recesses 14 on one surface thereof while leaving projections 15 which concentratedly receive an acoustic pressure. The piezoelectric body 31 is an example of piezoelectric body provided with non-perforating recesses 14 on two surfaces thereof. The recesses 14 may be formed by embossing, etc.

As is understood from the above description, the recesses formed in at least one surface of a piezoelectric body in the present invention may include those perforating (piercing) and those non-perforating to the other surface. In any case, an acoustic pressure concentrated to the remaining projections is applied to the piezoelectric body 1, 21 or 31 in the thickness direction to derive a piezoelectric property at an increased stress, and the effect of an application of the acoustic pressure is shielded from the closed recesses.

The planar shape of the piezoelectric bodies 1, 21 and 31 is arbitrary and may be circular, polygonal or in any other shape in addition to a rectangular one. Further, the planar shapes of the perforations 4 and the non-perforating recesses 14 are also arbitrary and can be polygonal, slit-shaped or shaped like grooves of a closed loop or annular ones instead of a circular one. It is preferred to dispose a pair of rigid members in a planar shape identical to that of a piezoelectric body 1 on the entirety of both surfaces 1*a* and 1*b* of the piezoelectric body 1 as shown in FIG. 1, but it is also possible to locally dispose such rigid members so as to cover only a part of the large number of the perforations 4 or recesses 14.

In the above embodiments, the recesses in a broad sense (inclusive of perforations) constituted as airtight internal spaces are filled with air. However, the internal spaces can be made vacuum or filled with another gas or a packing material, such as an elastomer resin or foam resin, having a larger compression deformability than that of the piezoelectric body so as not to hinder the displacement or deformation in the thickness direction of the piezoelectric body according to the acoustic pressure.

The piezoelectric bodies 1, 21 and 31 may be composed of, e.g., a polymeric piezoelectric material or a ceramic piezoelectric material, such as PZT, so as to constitute a hydrophone or a microphone. Particularly, a polymeric piezoelectric material may generally suitably be used to constitute a hydrophone in view of a small wave reflection characteristic (good acoustic transmission characteristic) because of a specific acoustic impedance between the piezoelectric material and the acoustic wave-transmitting medium. It is possible to constitute a piezoelectric body as a lamination of piezoelectric materials. The polarization direction of the piezoelectric body may be in the thickness direction as in the above embodiments or in the planar extension direction (electrodes may generally be disposed oppositely on side faces of the piezoelectric body in this case). However, in most cases, a larger $d_h$ constant can be obtained in case where the piezoelectric body is polarized in the thickness direction.

Preferred examples of the polymeric piezoelectric material used in the present invention may include vinylidene cyanide-vinyl acetate copolymer having a relatively high heat-resistance and vinylidene fluoride resin-based piezoelectric materials having excellent piezoelectric characteristics. Particularly, compared with vinylidene fluoride (VDF) homopolymer requiring a uniaxial stretching treatment for β-form crystallization exhibiting piezoelectricity, it is preferred to use VDF copolymers (e.g., copolymers of a major amount of VDF and a minor amount of trifluoro-ethylene (TrFE) or tetrafluoroethylene (TFE)) capable of β-form crystallization under ordinary crystallization conditions. The most preferred example is a copolymer of a major amount (particularly, 70–80 mol. %) of VDF and a minor amount (particularly 30–20 mol. %) of TrFE.

Such a polymeric piezoelectric material may be formed into a film, e.g., by melt-extrusion, followed by uniaxial stretching or heat treatment below the softening temperature as desired, and polarization according to electric field application below the softening temperature, to provide a polymer piezoelectric material in the form of a film or sheet. The polymeric piezoelectric material used in the present invention may have a thickness which is not particularly limited but may be in a range of 1 μm–2000 μm (2 mm) in its generally supplied form. The film or sheet of piezoelectric material may be used as a single layer or a laminate of 2–20 layers with identical polarization directions or alternately reverse polarization directions with an intermediate electrode layer between layers.

While depending on the magnitude of the pressure of an acoustic pressure expected to be received to some extent, the rigid member may generally be composed of hard resinous material, metallic material or ceramic material. The required degree of rigidity of the rigid member is such that the rigid member is free from warp or distortion at the recesses due to the acoustic wave, resulting in failure of effective communication of the acoustic pressure received at the outer surface of the rigid member to the surface of the piezoelectric body, and the pressure within the airtight recesses little changes accompanying the acoustic pressure. For example, in the case of a plastic material, such as vinyl chloride resin or acrylic resin, the rigid plate may preferably have a thickness of 1/10 or more, preferably ½ or more, of a representative size (e.g., diameter or width) of a recess concerned. The material and rigidity of the rigid member may be determined in some cases, by also taking into consideration factors such as a difference in specific acoustic impedance from that of the acoustic wave-transmitting medium, and a relationship between the inherent vibration frequency of a piezoelectric device including the rigid member and the frequency of the acoustic wave.

The electrodes 5a and 5b may be a vapor-deposition electrode or a foil electrode applied with an adhesive, respectively well-known heretofore, or may suitably be a thermally sprayed metal electrode (as disclosed in EP-A-0528279) or a perforated sheet electrode embedded at a surface of a piezoelectric material (as disclosed in EP Appln. No. 93309399.9). In case of, e.g., a piezoelectric device 10 comprising electrodes 5a and 5b disposed on the surfaces 1a and 1b of a piezoelectric body 1 as shown in FIGS. 1A and 1B, it is unnecessary to form perforations in the electrodes 5a and 5b corresponding to the perforations 4. In such a case, it is possible to use rigid plate electrodes functioning as combinations of the electrodes 5a and 5b and the rigid plates 2 and 3.

As shown in FIG. 1, the rigid plates 2 and 3 may generally be disposed in adhesion with or in abutment to the surfaces of the piezoelectric body 1 (or the electrodes 5a and 5b in case where such electrodes are formed thereon). However, e.g., in case where the piezoelectric body 1 (or the electrodes 5a and 5b formed thereon) constitutes a curved surface, it is possible to insert a stress-dispersing layer of, e.g., an elastomer resin, between the rigid plates and the piezoelectric body surfaces or electrode surfaces so as to apply a deforming stress uniformly onto the piezoelectric body surfaces. The elastomer resin may for example comprise silicone rubber, urethane rubber, chloroprene rubber or butyl rubber, or an adhesive composed therefrom.

In the wave-receiving piezoelectric device including an embodiment thereof shown in FIG. 1 described above, the rigid member of the present invention having a function of concentrating an acoustic pressure received by an outer surface thereof onto a pressed surface of a piezoelectric body may also be regarded as an acoustic pressure amplifier. In this case, a principal factor determining the amplifying rate is a void percentage or opening percentage defined as a ratio of the opening area of a recess to the entire area of the surface of a rigid member. The void percentage may generally be in the range of 10–90% in view of a significant increase in receiving sensitivity of acoustic wave and difficulty of recess formation.

Figure 4A:
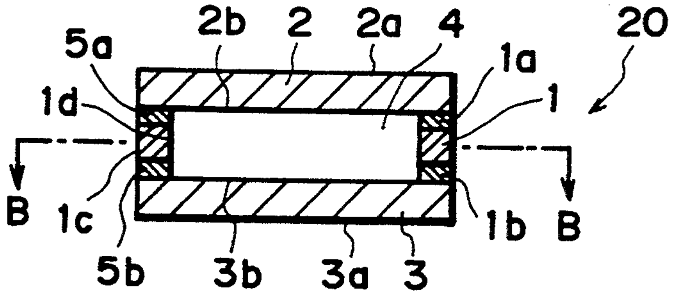
FIG. 4A is another embodiment of the wave-receiving piezoelectric device according to the present invention.
Figure 4B:
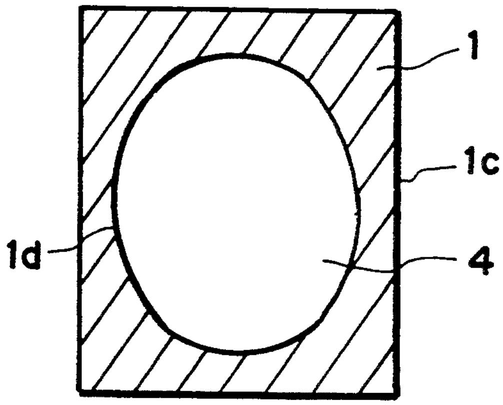
FIG. 4B is a thicknesswise sectional view taken along the line B—B as viewed in the direction of the arrows in FIG. 4A.

FIG. 4A is a thickness-wise sectional view of another embodiment of the wave-receiving piezoelectric device according to the present invention, and FIG. 4B is a B—B sectional view as viewed in the direction of arrows B—B in FIG. 4A. The piezoelectric device 20 shown in these figures is identical to the piezoelectric device 10 shown in FIGS. 1A and 1B, except that the piezoelectric body 1 used therein is provided with a single perforation 4 instead of the large number of perforations.

Also in the piezoelectric device 20, the perforation 4 is formed all through the piezoelectric body 1 and electrodes 5a and 5b. In the piezoelectric device 20, the piezoelectric body 1 may be polarized in the direction of thickness t but can alternatively be polarized in a direction perpendicular thereto, i.e., in the direction of a planar extension of the piezoelectric body. Further, the electrodes 5a and 5b need not be disposed on the surfaces 1a and 1b of the piezoelectric body but can alternatively be disposed on a side face 1c and an inner side face 1d opposite thereto of the piezoelectric body 1. In the latter case, however, it is necessary to pay a consideration so as not to hinder the displacement of the piezoelectric body in the thickness direction by the electrodes, e.g., by using a thin metal foil electrode, vapor-deposition electrode, etc.

Figure 5:
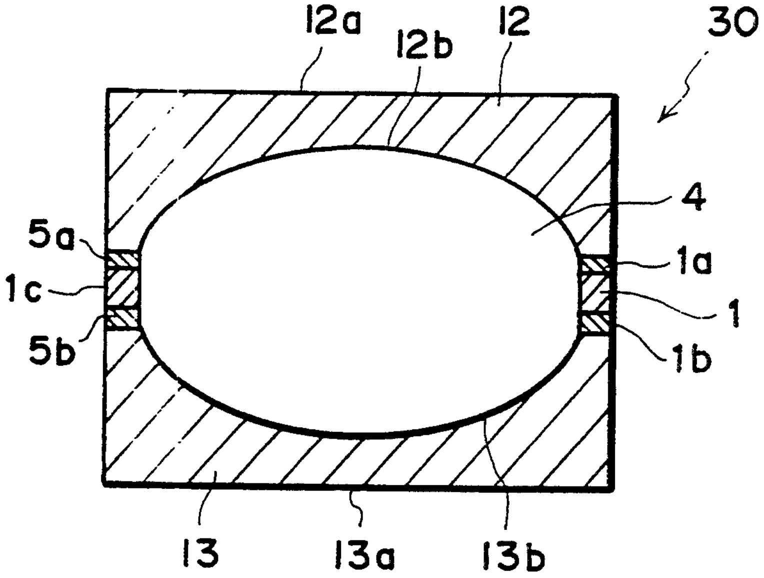
FIG. 5 is a thicknesswise sectional view of another embodiment of the wave-receiving piezoelectric device according to the present invention.

FIG. 5 is a thickness-wise sectional view, corresponding to FIG. 4A of another embodiment of the wave-receiving piezoelectric device according to the present invention. Referring to FIG. 5, the piezoelectric device 30 is identical to the piezoelectric device 20 shown in FIGS. 4A and 4B except that the piezoelectric body 1 is sandwiched between a pair of bowl-shaped rigid members 12 and 13 instead of the planar rigid plates 2 and 3.

In the piezoelectric device 20 or 30 shown in FIG. 4 or 5, the perforation 4 may be provided with a large inner diameter in a large area piezoelectric body 1 so as to obtain a high receiving sensitivity by increasing the above-mentioned void percentage. In such a case, however, if planar rigid plates 2 and 3 are used as in the piezoelectric device 20, the rigid plates can be deformed at the perforation 4 to fail to effectively transmit a pressure received at the outer surfaces 2a and 3a to the surfaces of the piezoelectric body 1, unless the rigid plates are extraordinarily rigid or thick. The piezoelectric device 30 solves the above problem by using the bowl-shaped rigid members 12 and 13 so as to prevent the deformation thereof. Incidentally, the rigid members used in the present invention need not be in the form of a plate which can be recognized to have substantially parallel major surfaces but can be bowl-shaped as in FIG. 5 or assume an arbitrary shape including an unevenness or an indefinite shape.

Figure 6:
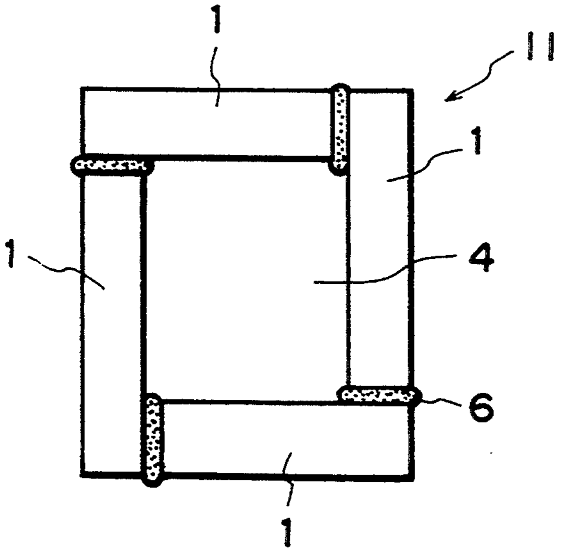
FIG. 6 is a thicknesswise sectional view of a combined piezoelectric body usable in the embodiments shown in FIGS. 4 and 5.

FIG. 6 is a plan view of a combined piezoelectric body 11 which can be used in place of the piezoelectric body 1 in the embodiment of FIG. 4 or 5. The combined piezoelectric body 11 comprises four stripes of piezoelectric bodies 1 which are alternately connected by an adhesive 6 so as to encircle a perforation 4. Thus, the piezoelectric body used in the present invention need not be a continuous body cut out from a single piezoelectric material.

[EXAMPLES]

Hereinbelow, some Examples and Comparative Examples of a hydrophone as a specific embodiment of the wave-receiving piezoelectric device according to the present invention are described.

Hydrophones produced in the Examples and Comparative Examples were evaluated with respect to the hydrostatic piezoelectric constant ($d_h$ constant) measured in the following manner.

A sample device was dipped in silicone oil contained in a pressure vessel, and the vessel was pressurized under a continuously increasing pressure P (Newton ($N/m^2$) from a nitrogen gas supply to measure a charge Q (Coulomb (C)) generated in the device. Then, a charge increment dQ corresponding to a pressure increment dP was measured in the neighborhood of a gauge pressure of 2 kg-f/cm$^2$ and the $d_h$ constant was calculated by the following equation (I):

$$d_h=(dQ/dP)/A \quad (I)$$

wherein A denotes the electrode area (m$^2$), and $d_h$ constant was obtained in the unit of C/N.

Comparative Example 1

A conventional sheet-form piezoelectric device was prepared in the following manner, A VDF/TrFE (75/25 mol ratio) copolymer (mfd. by Kureha Kagaku Kogyo K.K.) was extruded at a die temperature of 265° C. into a sheet, which was then subjected to heat treatment at 125° C. for 13 hours and a polarization treatment under an electric field of 75 MV/m for a total of 1 hour including a hold time of 5 min. at 123° C. and the accompanying temperature-raising and -lowering time. As a result, a 500 μm-thick polymer piezoelectric sheet was obtained.

Then, both surfaces of the sheet were roughened by sand blasting with alumina abrasive (particle size: #220) at an air pressure of 4.0 kg-f/cm$^2$ and a distance of 15 cm, and 70 μm-thick copper foils were applied onto the both surfaces with an SBR-based adhesive (a 10–20% solution in 1,2-dichloroethane (solvent) of an SBR-based adhesive ("4693 Scotch Grip", mfd. by Sumitomo 3M K.K.)). Then, the thus-formed piezoelectric body 1 provided with electrodes 5*a* and 5*b* on both surfaces was cut into a 6 cm-square sheet, at one corner of which lead wires were bonded to the both surfaces to provide a sheet-form piezoelectric device (hydrophone).

Example 1

A plurality of piezoelectric devices 10 as hydrophones as shown in FIGS. 1A and 1B were prepared each in the following manner.

A sheet-form piezoelectric device identical to the one prepared in Comparative Example 1 was perforated through the thickness to form a large number of perforations (each of 3.6 mm in diameter), and both electrode surfaces thereof were coated with a pair of 6 cm-square acrylic plates 2 and 3 (each with a lack at a corner for taking out the lead wire) via an SBR-based adhesive identical to the one used for the electrode application in Comparative Example 1, followed by bonding with preheating at 90° C. for 4 minutes and pressurization at 150 kg.f/cm$^2$ and 90° C. for 4 minutes, to obtain a piezoelectric device 10.

In preparation of each piezoelectric device 10, the sheet-form piezoelectric device was perforated at a substantially uniform distribution. As a result, a plurality of piezoelectric devices 10 having different void percentages (percentages of opening) as shown in Table 1 were prepared. Incidentally, the void percentages of the respective piezoelectric devices were obtained by calculation in terms of a weight ratio based on the weights before and after the perforation processing of each sheet-form piezoelectric device.

Example 2

A piezoelectric device 20 as a hydrophone as shown in FIGS. 4A and 4B was prepared in the following manner.

A sheet-form piezoelectric device identical to the one prepared in Comparative Example 1 was provided, and a 4 cm-dia. perforation was formed therein so as to align concentrically. Onto both surface of the perforated piezoelectric device, acrylic plates 2 and 3 each in a thickness of 7.5 mm were applied otherwise in the same manner as in Example 1 to obtain a piezoelectric device having a void percentage of 34.9%.

The thus-prepared various piezoelectric devices (hydrophones) were evaluated with respect to the piezoelectric characteristic according to the above-mentioned equation (I) and the results are inclusively shown in the following Table 1. In Table 1, Piezoelectric characteristic (1) refers to a real $d_h$ constant calculated by taking the electrode area A in the equation (I) as a remaining electrode area $A_1$ after the perforation determined by $A_1=A_0(100-x)/100$ wherein $A_0(=36\ cm^2)$ denotes the electrode area before the perforation and x (%) denotes the void percentage, and Piezoelectric characteristic (2) refers to a quasi $d_h$ constant calculated by substituting the electrode area $A_0$ before the perforation for the electrode area A in the equation (I). The $d_h$ constants thus obtained were all negative values but the absolute values thereof are listed in Table 1.

TABLE 1

| | Void percentage x (%) | Piezoelectric characteristic (1) $d_h$ (pC/N) | Piezoelectric characteristic (2) $d_h$ (pC/N) |
|---|---|---|---|
| Comp. Example 1 | 0 | 11.8 | 11.8 |
| Example 1 | 16.3 | 16.5 | 13.9 |
| | 23.6 | 23.0 | 17.6 |
| | 34.1 | 27.7 | 18.3 |
| | 50.2 | 41.1 | 20.5 |
| | 59.9 | 59.0 | 23.7 |
| | 64.4 | 66.5 | 23.7 |
| Example 2 | 34.9 | 16.5 | 10.7 |

The above measurement results show that the piezoelectric characteristic (particularly, Piezoelectric characteristic (1)) of the wave-receiving piezoelectric device according to the present invention was remarkably improved in accordance with an increase in void percentage compared with a control device (a piezoelectric device not subjected perforation or provision of rigid plates. Comparative Example 1). Further, even Piezoelectric characteristic (2) (i.e., a quasi-piezoelectric constant $d_h$ calculated by using the electrode area $A_0$ before the perforation as the electrode area A in the equation (I)) was increased significantly in accordance with an increase in void percentage. It was amazing to us that the increase in void percentage x caused an increase in $d_h$ constant in excess of the increase corresponding to the concentration of the acoustic pressure onto the surface of the piezoelectric body (the latter increase alone being expected to provide a substantially constant value of Piezoelectric characteristic (2)).

Such an additional increase in $d_h$ constant was linear with respect to the increase in void percentage x and may presumably be attributable to a factor that the enhanced stress preferentially contributed to an increase in $d_{33}$ constant or that the contribution of $d_{31}$ and $d_{32}$ constants to the $d_h$ constant, i.e., the influence of the acoustic pressure acting on the side walls of the piezoelectric body and causing the deformation in the planar extension direction of the piezoelectric body, was restricted to the portion acting only to the peripheral side of the piezoelectric body due to the presence of the perforations 4 which were shielded from the acoustic pressure. The quasi piezoelectric constant (characteristic (2)) is assumed to theoretically approach the $d_{33}$ constant as the void percentage approaches 100% while the extrapolation of the experimental values indicated a value slightly lower value than $d_{33}$=ca. −40 pC/N. We have already proposed a piezoelectric device which is provided with an acoustic pressure-shielding member disposed in opposition to the side face of a piezoelectric body to show a piezoelectric performance close to the $d_h$ constant (Japanese Patent Appln. No. 75009/1993, filed Mar. 10, 1993), and the present invention may be said to accomplish a similar object in the quasi-piezoelectric constant. The piezoelectric device of Example 2 provided with a large perforation caused a slight decrease in quasi-piezoelectric constant and the decrease may presumably be attributable to a factor that the acrylic plates as rigid members of the present invention sandwiching the piezoelectric body were warped, thereby failing to transmit the acoustic pressure received by the outer surfaces of the acrylic plates sufficiently to the surfaces of the piezoelectric body. This difficulty can be alleviated by using rigid members having an enhanced rigidity as a whole against the warping as shown in FIG. 5.

As described above, according to the present invention, it is possible to realize a piezoelectric device utilizing a piezoelectric characteristic at an enhanced acoustic pressure to show an improved receiving sensitivity by providing a piezoelectric body having two surfaces sandwiching a thickness and including at least one surface provided with a recess and covering the surface provided with a recess with a rigid member to make the recess airtight.

What is claimed is:

1. An acoustic wave-receiving piezoelectric device for converting acoustic wave energy incident from outside of the piezoelectric device into electric energy, comprising:

a piezoelectric body having two surfaces sandwiching a thickness and including at least one surface provided with a recess set in the thickness direction, and a rigid member having a contact surface and an outer surface opposite to the contact surface and disposed to cover said at least one surface with the contact surface so as to make the recess airtight, said piezoelectric device having a structure such that the airtight recess is retained therein without hindering a displacement of the piezoelectric body in its thickness direction in response to an acoustic pressure received by the outer surface, whereby the acoustic pressure received by the outer surface is concentrated and a resultant increased acoustic pressure is applied onto said at least one surface of the piezoelectric body to provide an increased piezoelectric output.

2. The piezoelectric device according to claim 1, wherein the piezoelectric body is polarized in the thickness direction and the two surfaces are respectively coated with an electrode.

3. The piezoelectric device according to claim 1, wherein said piezoelectric body comprises a polymeric piezoelectric material.

4. The piezoelectric device according to claim 1, wherein said piezoelectric body comprises a ceramic piezoelectric material.

5. The piezoelectric device according to claim 1, which constitutes a hydrophone or a microphone.

6. The piezoelectric device according to claim 1, wherein said piezoelectric body is provided with a plurality of the recess at a substantially uniform density.

7. The piezoelectric device according to claim 1, wherein said recess communicates with another surface of the piezoelectric body to form a perforation.

8. The piezoelectric device according to claim 7, wherein said piezoelectric body is provided with a plurality of perforations at a substantially uniform density.

9. The piezoelectric device according to claim 1, wherein the two surfaces of the piezoelectric body are respectively covered with a rigid member.

10. The piezoelectric device according to claim 1, wherein said piezoelectric body is provided with a single perforation covered with two rigid members.

11. The piezoelectric device according to claim 10, wherein the two rigid members have a shape of bowl with a concave inner surface confronting the perforation.

12. The piezoelectric device according to claim 1, wherein said piezoelectric body comprises a combination of plural piezoelectric bodies combined so as to encircle a perforation.

* * * * *